United States Patent
Ku

(10) Patent No.: US 6,455,405 B1
(45) Date of Patent: Sep. 24, 2002

(54) USING IMPLANTATION METHOD TO CONTROL GATE OXIDE THICKNESS ON DUAL OXIDE SEMICONDUCTOR DEVICES

(75) Inventor: Shao-Yen Ku, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/055,093

(22) Filed: Jan. 23, 2002

(51) Int. Cl.⁷ ......................................... H01L 21/3205
(52) U.S. Cl. ..................... 438/585; 438/578; 438/440; 438/587; 438/966; 438/981
(58) Field of Search .................. 438/585, 528, 438/440, 587, 966, 981

(56) References Cited

U.S. PATENT DOCUMENTS 6,169,018 B1 * 1/2001 Lee ............................ 438/587
6,399,448 B1 * 6/2002 Mukhopadhyay et al. .. 438/275
6,410,991 B1 * 6/2002 Kawai et al. ................ 257/392

* cited by examiner

Primary Examiner—Trung Dang
(74) Attorney, Agent, or Firm—George O. Saile; Stephen B. Ackerman; Stephen G. Stanton

(57) ABSTRACT

A method for forming dual thickness gate oxide layers comprising the following steps. A structure having at least a first area and a second area is provided. The second area of the structure is masked. Ion implanting $Si^{4+}$ or $Ge^{4+}$ ions into the unmasked first area of the structure to form an amorphous layer within the first area of the structure. The second area of the structure is unmasked. The first and second areas of the structure are oxidized to form: a first gate oxide layer upon the structure within the first area; and a second gate oxide layer upon the structure within the second area. The first gate oxide layer having a greater thickness than the second gate oxide layer, completing formation of the dual thickness gate oxide layers.

30 Claims, 2 Drawing Sheets

USING IMPLANTATION METHOD TO CONTROL GATE OXIDE THICKNESS ON DUAL OXIDE SEMICONDUCTOR DEVICES

FIELD OF THE INVENTION

The present invention relates generally to semiconductor fabrication and more specifically to methods of forming dual thickness gate oxide layers.

BACKGROUND OF THE INVENTION

The current process to grow dual thickness gate oxide layers is: forming a first gate oxide on a silicon substrate; masking a portion of the first gate oxide with a photoresist layer; wet etching to remove the exposed portion of the first gate oxide; stripping the photoresist masking layer; then growing gate oxide at the wet etched silicon substrate portion and additional gate oxide at the first gate oxide portion to form dual thickness gate oxide portions of about 70 Å and about 140 Å.

U.S. Pat. No. 5,918,116 to Chittipeddi describes a dual gate oxide process that forms a thicker oxide using an amorphizing ion implantation using, for example, silicon, fluorine, arsenic and mixtures thereof.

U.S. Pat. No. 6,133,164 to Kim describes a dual oxide process using an oxygen implant.

U.S. Pat. Nos. 5,920,779 to Sun et al., U.S. Pat. No. 6,093,659 to Grider et al., U.S. Pat. No. 6,030,862 to Kepler and U.S. Pat. No. 6,165,849 to An et al. are related dual oxide and ion implantation patents.

SUMMARY OF THE INVENTION

Accordingly, it is an object of one or more embodiments of the present invention to provide an improved method of forming dual thickness gate oxide layers.

Other objects will appear hereinafter.

It has now been discovered that the above and other objects of the present invention may be accomplished in the following manner. Specifically, a structure having at least a first area and a second area is provided. The second area of the structure is masked. Ion implanting $Si^{4+}$ or $Ge^{4+}$ ions into the unmasked first area of the structure to form an amorphous layer within the first area of the structure. The second area of the structure is unmasked. The first and second areas of the structure are oxidized to form: a first gate oxide layer upon the structure within the first area; and a second gate oxide layer upon the structure within the second area. The first gate oxide layer having a greater thickness than the second gate oxide layer, completing formation of the dual thickness gate oxide layers.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
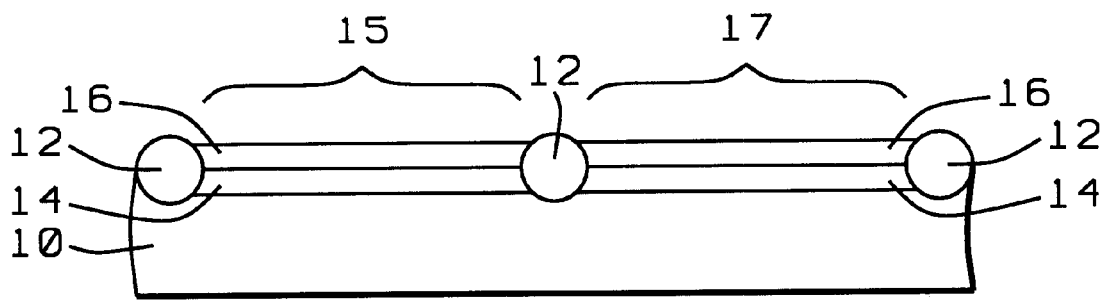
FIGS. 1 to 5 schematically illustrate a preferred embodiment of the present invention.

As shown in FIG. 1, structure 10 is preferably a silicon substrate or a epitaxial silicon substrate and is understood to possibly include a semiconductor wafer or substrate.

To clean the surface of structure 10, sacrificial oxide layer 14 is grown upon structure 10 to a thickness of preferably from about 100 to 300 Å. A protection layer 16, preferably silicon nitride (SiN), is grown over sacrificial oxide layer 14 to a thickness of preferably from about 1000 to 2000 Å.

An isolation structure/structures 12 is/are formed in structure 10 to divide structure 10 into two or more areas 15, 17. Isolation structures 12 may be shallow trench isolation (STI) structures, field oxide, LOCOS, sealed-interface local oxidation (SILO) or selective epitaxial growth (SEG), etc.

Strip Protection Layer 16

Figure 2:
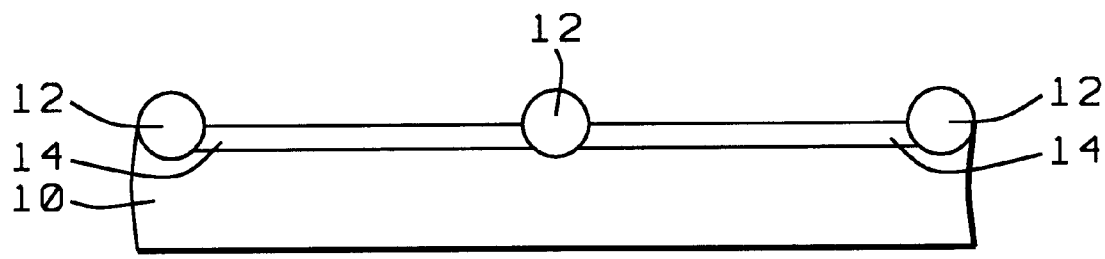

As shown in FIG. 2, the SiN protection layer 16 is stripped from over the sacrificial oxide layer 14 preferably using a hot $H_3PO_4$ process (from about 145 to 165° C.).

Ion Implantation 18

Figure 3:
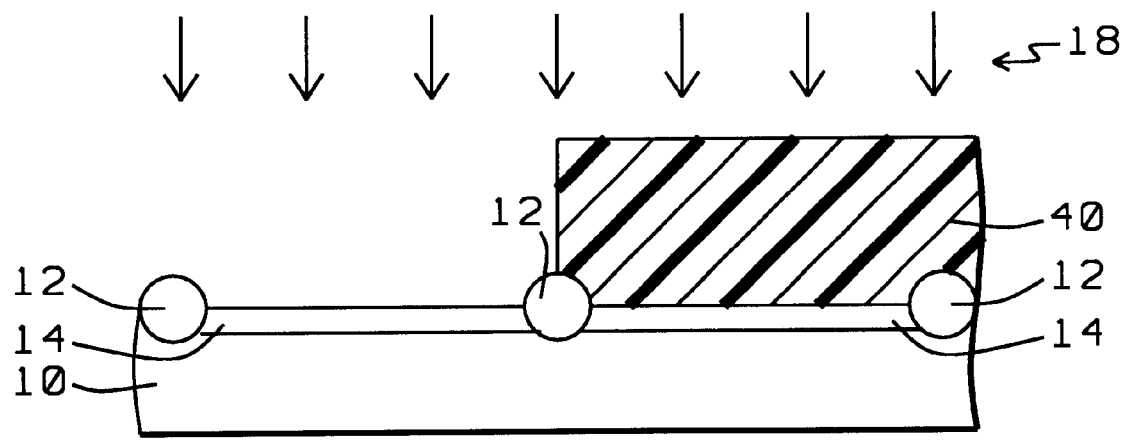

As shown in FIG. 3, a masking layer 40, preferably comprised of photoresist, is formed over at least one area of structure 10. As shown in FIG. 3, the structure 10 within area 17 is masked using a photoresist mask 40.

In one key step of the invention an ion implantation 18 is conducted through the surface of the structure 10 within area 15 to form amorphous layer 20. The ions implanted are ions having a +4 valence, i.e. either silicon ($Si^{4+}$) ions or germanium ($Ge^{4+}$) ions.

The inventor has discovered that while other species will impact the dopant profile and influence subsequently formed device characteristics (such as the device threshold voltage), the ion implantation of $Si^{4+}$ ions or $Ge^{4+}$ ions can be covered by oxidation or an anneal process and do not impact the substrate 10 dopant due to their +4 charge.

Further, it is also possible to then form a shallow junction through the implantation of boron (B) or phosphorus (P) ions near the substrate 10 surface over the $Si^{4+}$ or $Ge^{4+}$ ions after oxidation as the B or P ions will be blocked by the underlying $Si^{4+}$ or $Ge^{4+}$ ions. The amorphous layer 20 will disturb the B/P diffusion to the inner substrate 10 since the silicon path was damaged by the $Si^{4+}$ or $Ge^{4+}$ ion implantation.

The $Si^{4+}$ or $Ge^{4+}$ ions are implanted to a concentration of from about 4E15 to 6E15 atoms/cm$^3$ at an energy of preferably from about 15 to 75 keV and more preferably about 5E15 atoms/cm$^3$ at an energy of more preferably from about 30 to 60 keV.

Stripping of Masking Layer 40 and the Sacrificial Oxide Layer 14 Within Areas 15 and 17

Figure 4:
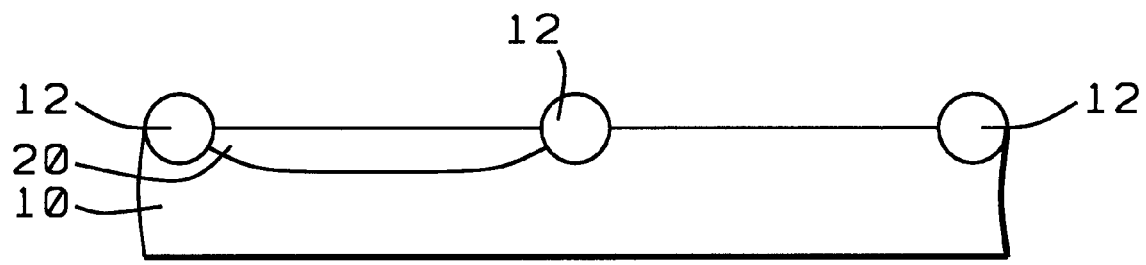

As shown in FIG. 4, masking layer 40 is stripped and removed from the structure 10 with the remaining sacrificial oxide layer 14 within areas 15 and 17.

Growth of Gate Oxide Layers 30, 32

Figure 5:
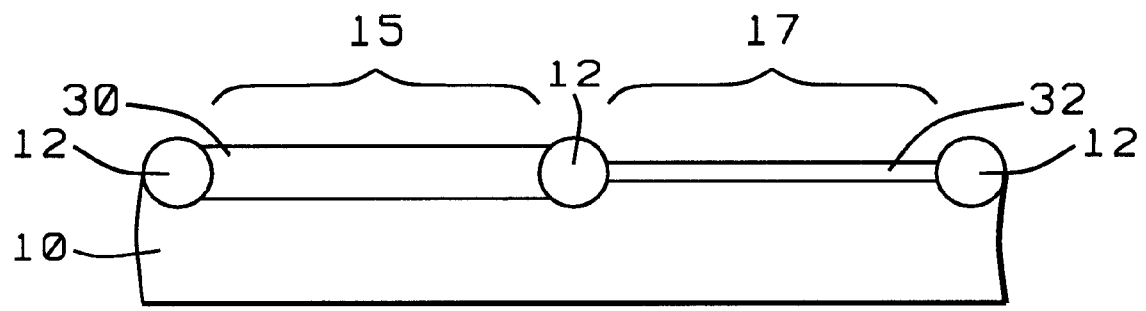

As shown in FIG. 5, the structure 10 is oxidized to form: gate oxide layer 30 within area 15 formed from the amorphous layer 20; and thinner gate oxide layer 32 within area 17. The characteristics of the amorphous layer 20 formed by the ion implantation 18 causes the area 15 gate oxide layer 30 to be thicker than the area 17 gate oxide layer 32.

Thicker gate oxide layer 30 is preferably from about 100 to 200 Å thick and is more preferably from about 140 to 160 Å thick. Thinner gate oxide layer 32 is preferably from about 50 to 100 Å thick and is more preferably from about 60 to 80 Å thick. The thicknesses of gate oxide layers 30, 32 are controlled by the $Si^{4+}$ or $Ge^{4+}$ ion dosage and energy mixture. A high energy and high $Si^{4+}$ or $Ge^{4+}$ ion dosage will obtain a thicker gate oxide layer 30. Concerning the shallow junction issue, one may implant with low energy and a high $Si^{4+}$ or $Ge^{4+}$ ion dosage to the silicon substrate.

This completes formation of the dual thickness gate oxide layers 30, 32.

Further processing may proceed to form semiconductor devices over the thicker and thinner gate oxide layers 30, 32.

Advantages of the Present Invention

The advantages of one or more embodiments of the present invention include:

1. process simplification;
2. cost reduction; and
3. shallow junction formation

While particular embodiments of the present invention have been illustrated and described, it is not intended to limit the invention, except as defined by the following claims.

I claim:

1. A method for forming dual thickness gate oxide layers, comprising the steps of:
   providing a structure having at least a first area and a second area;
   masking the second area of the structure;
   ion implanting $Si^{4+}$ or $Ge^{4+}$ ions into the unmasked first area of the structure to form an amorphous layer within the first area of the structure;
   unmasking the second area of the structure; and
   oxidizing the first and second areas of the structure to form a first gate oxide layer n the structure within the first area and a second gate oxide layer upon the structure within the second area; the first gate oxide layer having a greater thickness than the second gate oxide layer, completing formation of the dual thickness gate oxide layers.

2. The method of claim 1, wherein the $Si^{4+}$ or $Ge^{4+}$ ions are implanted to a concentration of from about 4E15 to 6E15 atoms/cm$^3$ at an energy of preferably from about 15 to 75 keV.

3. The method of claim 1, wherein the $Si^{4+}$ or $Ge^{4+}$ ions are implanted to a concentration of about 5E15 atoms/cm$^3$ at an energy of preferably from about 30 to 60 keV.

4. The method of claim 1, wherein the structure is a silicon substrate or an epitaxial silicon substrate.

5. The method of claim 1, wherein the at least first area and second area are separated by one or more isolation structures.

6. The method of claim 1, wherein the at least first area and second area are separated by one or more isolation structures; the one or more isolation structures being structures selected from the group consisting of shallow trench isolation (STI) structures, field oxide, LOCOS, SILO and SEG.

7. The method of claim 1, wherein the first gate oxide layer is from about 100 to 200 Å thick and the second gate oxide layer is from about 50 to 100 Å thick.

8. The method of claim 1, wherein the first gate oxide layer is from about 140 to 160 Å thick and the second gate oxide layer is from about 60 to 80 Å thick.

9. The method of claim 1, wherein the second area of the structure is masked using photoresist.

10. A method for forming dual thickness gate oxide layers, comprising the steps of:
    providing a structure;
    forming a sacrificial oxide layer upon the structure;
    forming a silicon nitride layer over the sacrificial oxide layer;
    forming an isolation structure in the structure to separate the structure into a first area and second area;
    stripping the silicon nitride layer from the sacrificial oxide layer;
    masking the second area of the structure;
    ion implanting $Si^{4+}$ or $Ge^{4+}$ ions into the unmasked first area of the structure to form an amorphous layer within the first area of the structure;
    unmasking the second area of the structure;
    removing the sacrificial oxide layer from the first area and the second area; and
    oxidizing the first and second areas of the structure to form a first gate oxide layer upon the structure within the first area and a second gate oxide layer upon the structure within the second area; the first gate oxide layer having a greater thickness than the second gate oxide layer, completing formation of the dual thickness gate oxide layers.

11. The method of claim 10, wherein the $Si^{4+}$ or $Ge^{4+}$ ions are implanted to a concentration of from about 4E15 to 6E15 atoms/cm$^3$ at an energy of preferably from about 15 to 75 keV.

12. The method of claim 10, wherein the $Si^{4+}$ or $Ge^{4+}$ ions are implanted to a concentration of about 5E15 atoms/cm$^3$ at an energy of preferably from about 30 to 60 keV.

13. The method of claim 10, wherein the structure is a silicon substrate or an epitaxial silicon substrate.

14. The method of claim 10, wherein the isolation structure is a structure selected from the group consisting of a shallow trench isolation (STI) structure, field oxide, LOCOS, SILO and SEG.

15. The method of claim 10, wherein the first gate oxide layer is from about 100 to 200 Å thick and the second gate oxide layer is from about 50 to 100 Å thick.

16. The method of claim 10, wherein the first gate oxide layer is from about 140 to 160 Å thick and the second gate oxide layer is from about 60 to 80 Å thick.

17. The method of claim 10, wherein the sacrificial oxide layer is from about 100 to 300 Å thick.

18. The method of claim 10, wherein the silicon nitride layer is from about 1000 to 2000 Å thick.

19. The method of claim 10, wherein the sacrificial oxide layer is from about 100 to 300 Å thick and the silicon nitride layer is from about 1000 to 2000 Å thick.

20. The method of claim 10, wherein the second area of the structure is masked using photoresist.

21. A method for forming dual thickness gate oxide layers, comprising the steps of:
    providing a structure;
    forming a sacrificial oxide layer upon the structure;
    forming a silicon nitride layer over the sacrificial oxide layer;
    forming an isolation structure in the structure to separate the structure into a first area and second area;
    stripping the silicon nitride layer from the sacrificial oxide layer;
    masking the second area of the structure;
    ion implanting $Si^{4+}$ or $Ge^{4+}$ ions into the unmasked first area of the structure to form an amorphous layer within the first area of the structure; the $Si^{4+}$ or $Ge^{4+}$ ions being implanted to a concentration of from about 4E15 to 6E15 atoms/cm$^3$ at an energy of preferably from about 15 to 75 keV;
    unmasking the second area of the structure;
    removing the sacrificial oxide layer from the first area and the second area; and
    oxidizing the first and second areas of the structure to form a first gate oxide layer upon the structure within the first area and a second gate oxide layer upon the structure within the second area; the first gate oxide layer having a greater thickness than the second gate oxide layer, completing formation of the dual thickness gate oxide layers.

22. The method of claim 21, wherein the $Si^{4+}$ or $Ge^{4+}$ ions are implanted to a concentration of about 5E15 atoms/cm$^3$ at an energy of preferably from about 30 to 60 keV.

23. The method of claim 21, wherein the structure is a silicon substrate or an epitaxial silicon substrate.

24. The method of claim 21, wherein the isolation structure is a structure selected from the group consisting of a shallow trench isolation (STI) structure, field oxide, LOCOS, SILO and SEG.

25. The method of claim 21, wherein the first gate oxide layer is from about 100 to 200 Å thick and the second gate oxide layer is from about 50 to 100 Å thick.

26. The method of claim 21, wherein the first gate oxide layer is from about 140 to 160 Å thick and the second gate oxide layer is from about 60 to 80 Å thick.

27. The method of claim 21, wherein the sacrificial oxide layer is from about 100 to 300 Å thick.

28. The method of claim 21, wherein the silicon nitride layer is from about 1000 to 2000 Å thick.

29. The method of claim 21, wherein the sacrificial oxide layer is from about 100 to 300 Å thick and the silicon nitride layer is from about 1000 to 2000 Å thick.

30. The method of claim 21, wherein the second area of the structure is masked using photoresist.

* * * * *